United States Patent
Cheng et al.

(10) Patent No.: US 8,020,122 B2
(45) Date of Patent: Sep. 13, 2011

(54) CIRCUIT SPLITTING IN ANALYSIS OF CIRCUITS AT TRANSISTOR LEVEL

(75) Inventors: Chung-Kuan Cheng, San Diego, CA (US); Zhengyong Zhu, Sunnyvale, CA (US); Rui Shi, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 648 days.

(21) Appl. No.: 11/916,925

(22) PCT Filed: Jun. 7, 2005

(86) PCT No.: PCT/US2005/020242
§ 371 (c)(1),
(2), (4) Date: Jul. 14, 2008

(87) PCT Pub. No.: WO2006/132639
PCT Pub. Date: Dec. 14, 2006

(65) Prior Publication Data
US 2009/0132975 A1   May 21, 2009

(51) Int. Cl.
*G06F 17/50* (2006.01)
(52) U.S. Cl. ........ 716/105; 716/100; 716/101; 716/102; 716/103; 716/104; 703/13; 703/14
(58) Field of Classification Search .......... 716/100–105; 703/13–14
See application file for complete search history.

(56) References Cited

U.S. PATENT DOCUMENTS

| | | | |
|---|---|---|---|
| 5,313,398 A | 5/1994 | Rohrer et al. | |
| 5,379,231 A * | 1/1995 | Pillage et al. | 703/14 |
| 5,467,291 A | 11/1995 | Fan et al. | |
| 5,694,052 A | 12/1997 | Sawai et al. | |
| 5,790,415 A | 8/1998 | Pullela et al. | |
| 5,888,875 A | 3/1999 | Lasky | |
| 6,141,676 A | 10/2000 | Ramirez-Angulo et al. | |
| 6,308,300 B1 | 10/2001 | Bushnell et al. | |
| 6,437,804 B1 * | 8/2002 | Ibe et al. | 715/736 |
| 6,557,148 B1 | 4/2003 | Nishida et al. | |
| 6,577,992 B1 | 6/2003 | Tcherniaev et al. | |
| 6,662,149 B1 | 12/2003 | Devgan et al. | |
| 6,665,849 B2 | 12/2003 | Meuris et al. | |
| 6,732,310 B1 * | 5/2004 | Chakradhar et al. | 714/726 |
| 6,789,237 B1 * | 9/2004 | Ismail | 716/113 |
| 6,807,520 B1 * | 10/2004 | Zhou et al. | 703/14 |
| 2002/0131135 A1 | 9/2002 | Chow et al. | |
| 2003/0065965 A1 | 4/2003 | Korobkov | |

(Continued)

FOREIGN PATENT DOCUMENTS

WO    WO 2004/109452    12/2004

(Continued)

OTHER PUBLICATIONS

Acar et al., "TETA: Transistor Level Waveform Evaluation for Timing Analysis," IEEE Trans. on Computer-Aided Design, vol. 21, No. 5, (May 2002).

(Continued)

*Primary Examiner* — Nghia M Doan
(74) *Attorney, Agent, or Firm* — Perkins Coie LLP

(57) ABSTRACT

Operating splitting methods for splitting a circuit into two sub circuits and analyzing the two sub circuits with improved computation efficiency and processing speed.

25 Claims, 9 Drawing Sheets

U.S. PATENT DOCUMENTS

| | | | |
|---|---|---|---|
| 2003/0075765 | A1 | 4/2003 | Ohnakado et al. |
| 2003/0200071 | A1 | 10/2003 | Zhang et al. |
| 2003/0204828 | A1 | 10/2003 | Iwanishi |
| 2004/0008096 | A1 | 1/2004 | Liu et al. |
| 2004/0044510 | A1 | 3/2004 | Zolotov et al. |
| 2005/0076318 | A1 | 4/2005 | Croix et al. |
| 2005/0096888 | A1 | 5/2005 | Ismail |
| 2005/0102124 | A1 | 5/2005 | Root et al. |

FOREIGN PATENT DOCUMENTS

| | | |
|---|---|---|
| WO | WO 2007/005005 | 1/2007 |

OTHER PUBLICATIONS

Afshari, E., et al., "Non-Linear Transmission Lines for Pulse Shaping in Silicon," Proc. Of IEEE Custom Integrated Circuits Conference, pp. 91-94, Sep. 2003.

Backhouse et al., "WSix Thin Film for Resistors," Thin Solid Films, vol. 311, No. 1-2, pp. 299-303 (1997).

Beattie, M., et al., "IC Analyses Including Extracted Inductance Models" Proceedings of the $36^{th}$ ACM/IEEE conference on Design automation. Jun. 21-25, 1999, pp. 915-920 (6 pages). New Orleans, LA, USA.

Beckmann, B.M., et al., "TLC: Transmission Line Caches," Proceedings of the $36^{th}$ IEEE International Symposium on Microarchitecture (MICRO-36'03), 12 pages (2003).

Blaauw, D., et al., "Design and Analysis of Power Distribution Networks," Design of high-performance microprocessor circuits, Chapter 24, pp. 499-521, IEEE Press 2001 by the Institute of Electrical and Electronics Engineers, Inc., 3 Park Avenue, $17^{th}$ Floor, New York, NY, USA.

Black, J.R., "Electromigration Failure Modes in Aluminum Metalization for Semiconductor Devices," Proc. IEEE, pp. 1587-1594, (2003).

Bobba et al., "IC power distribution challenges," IEEE/ACM International Conference on Computer Aided Design, pp. 643-650, (2001).

Brandt, A., "Multi-level adaptive solutions to boundary value problems," Math. Comput., 31:333-390 (1977).

Cao et al., "HiPRIME: Hierarchical and Passivity Reserved Interconnect Macromodeling Engine for RLKC Power Delivery," IEEE/ACM Design Automation Conference, pp. 379-384, (2002).

Chang et al, "RF/Wireless Interconnect for Inter- and Intra-Chip Communications," Proceedings of the IEEE, vol. 89, No. 4, pp. 456-466 (2001).

Chang et al., "Near Speed-of-Light Signaling Over On-Chip Electrical Interconnects," IEEE Journal of Solid-State Circuits, vol. 38, No. 5, pp. 834-838 (2003).

Chen, H., et al., "Interconnect and circuit modeling techniques for full-chip power supply noise analysis," IEEE Transactions on Components, Packaging, and Manufactured Technology, Part B, vol. 21, No. 3, pp. 209-215, Aug. 1998.

Chen, H., et al., "Surfliner: a distortionless electrical signaling scheme for speed of light on-chip communications," Proceedings of the 2005 International Conference on Computer Design (ICCD '05), 6 pages, (2005).

Chen, T., et al., "Efficient Large-Scale Power Grid Analysis Based on Preconditioned Krylov-Subspace Iterative Methods," Proc. $38^{th}$ Design Automation Conf. (IEEE Cat. No. 01CH37232), ACM, New York, NY, USA, pp. 559-562, Jun. 2001.

Dally et al, "High-Performance Electrical Signaling," IEEE Integrated Conference on Massively Parallel Processing Using Optical Interconnections, 6 pages, Jun. 1998.

Dally, W., "More about Wires Lossy Wires, Multi-Drop Buses, and Balanced Lines," EE273 Lecture 3 (10 pages). Sep. 30, 1998, Computer Systems Laboratory, Stanford University.

De Geus, A.J., "SPECS: simulation program for electronic circuits and systems." In Proceedings of the International Symposium on Circuits and Systems, pp. 534-537, May 7-10, 1984. Queen Elizabeth Hotel, Montreal, Canada.

Devgan, A., et al, "How to Efficiently Capture On-Chip Inductance Effect: Introducing a New Circuit Element K," Proc. ICCAD 2000, pp. 150-155 (Nov. 2000).

Devgan, A., et al., "Adaptively Controlled Explicit Simulation." IEEE Transactions on Computer-Aided Design of ICs and Systems, vol. CAD-13(6), pp. 746-762, Jun. 1994.

Feldmann, P., et al., "Reduced-order modeling of large linear subcircuits via a block Lanczos algorithm," Proceedings of $32^{nd}$ DAC, pp. 474-479, 1995. San Francisco, California. ISBN:0-89791-725-1.

Gala, K., et al., "On Chip Inductance Modeling and Analysis," pp. 63-68. Inductance Models, DAC, Jun. 2000. Los Angeles, California.

He, L., et al., "An Efficient Inductance Modeling for Onchip Interconnects," CICC, May 1999, pp. 457-460. Town and Country Hotel, San Diego, California.

Ho et al., "The Future of Wires," Proc. of IEEE, vol. 89, No. 4, pp. 490-504 (Apr. 2001).

Ho, R., et al., "Efficient On-Chip Global Interconnectors," 2003 Symposium on VLSI Circuits Digest of Technical Papers, pp. 271-274, Jun. 2003.

International Search Report and Written Opinion dated Jun. 2, 2006, for PCT/US05/20369, international filing date Jun. 8, 2005 (9 pages).

Jokerst et al, "The Heterogeneous Integration of Optical Interconnections Into Integrated Microsystems," IEEE Journal of Selected Topics in Quantum Electronics, vol. 9, No. 2, pp. 350-360 (Mar./Apr. 2003).

Katopis, G.A., "Delta-I Noise Specification for a High-performance Computing Machine," Proc. of the IEEE, vol. 73, pp. 1450-1415, (1985). [Meditech, "Correction to: Katopis, G.A., 'Delta-I Noise Specification for a High-performance Computing Machine,' Proc. of the IEEE, vol. 73, pp. 1450-1415, (1985)," Proceedings of the IEEE 70(12): 1864 (Dec. 1985) attached following Katopis article].

Kerns, K.J., et al, "Stable and efficient reduction of substrate model networks using congruence transforms," Proceedings of ICCAD, pp. 207-214, 1995. San Jose, California.

Kozhaya et al., "A multigrid-like technique for power grid analysis," IEEE Transactions on Computer-Aided Design of Integrated Circuits, vol. 21, Issue 10, pp. 1148-1160, Oct. 2002.

Kozhaya et al., "Multigrid-like technique for power grid analysis," IEEE/ACM International Conference on Computer Aided Design, 2001, pp. 480-487. Nov. 4-8, 2001. San Jose, California.

Krauter, B., et al., "Generating Sparse Partial Inductance Matrices with Guaranteed Stability," Proceedings of the 1995 IEEE/ACM international conference on Computer-aided design. San Jose, California, pp. 45-52 (1995).

Kuhn et al., "Integration of Mixed-Signal Elements into a High-Performance Digital CMOS Process," Intel Technology Journal, vol. 6, Issue 2, pp. 31-42 (May 16, 2002).

La Scala et al., "A relaxation type multigrid parallel algorithm for power system transient stability analysis," IEEE International Symposium on Circuits and Systems, May 8-11, 1989. Portland, Oregon, vol. 3, pp. 1954-1957.

La Scala, M., et al., "Relaxation/Newton methods for concurrent time step solution of differential-algebraic equations in power system dynamic simulations," IEEE Transactions on Circuits and Systems 1: Fundamental Theory and Applications, vol. 40, Issue 5, pp. 317-330, (May 1993).

Lahaye, D., et al., "Algebraic Multigrid for Complex Symmetric Systems," IEEE Transactions on Magnetics, 36(4): 1535-1538, Jul. 2000. Published by IEEE Service Center, New York, NY, USA.

Lee, Y., et al., "Power Grid Transient Simulation in Linear Time Based on Transmission-Line-Modeling Alternating-Direction-Implicit Method," IEEE/ACM International Conference on Computer Aided Design, pp. 75-80, (2001).

Lee, Y.M., et al., "The power grid transient simulation in linear time on 3D alternating-direction-implicit method," Proceedings of the Design, Automation and Test in Europe Conference and Exhibition. pp. 1020-1025, (2003).

Lelarasmee, E., et al., "The Waveform relaxation method for the time-domain analysis of large scale integrated circuits." IEEE Transactions on Computer-Aided Design of ICs and Systems, vol. CAD-1(3), pp. 131-145, Jul. 1982.

Li, Z., et al., "SILCA: Fast-Yet-Accurate Time-Domain Simulation of VLSI Circuits with Strong Parasitic Coupling Effects," pp. 793-799, ICCAD 2003. San Jose, California.

Lin, S., "Stepwise equivalent conductance of circuit simulation." IEEE Transactions on Computer-Aided Design of ICs and Systems, vol. CAD-12(5), pp. 672-683, May 1993.

Lin, S., et al., "Challenges in Power-Ground Integrity," IEEE/ACM International Conference on Computer Aided Design, pp. 651-654, (2001).

Lin, S., et al., "Transient simulation of lossy interconnects based on the recursive convolution formulation," IEEE Transactions on CAS I: Fundamental Theory and Applications, vol. 39, pp. 879-892. Nov. 1992.

Maheshwari, A., et al., "Differential Current-Sensing for On Chip Interconnects," IEEE Transactions on Very Large Scale Integration (VLSI) Systems, vol. 12, No. 12, pp. 1321-1329 (Dec. 2004).

Namiki, T., et al., "New FDTD algorithm free from the CFL condition restraint for a 2D-TE wave," IEEE Antennas Progagat. Symp. Dig., pp. 192-195, (Jul. 1999).

Nassif, S.R., "Fast Power Grid Simulation," IEEE/ACM Design Automation Conference, pp. 156-161, (2000).

Nassif, S.R., et al., "Multigrid methods for power grid simulation," The 2000 IEEE International Symposium on Circuits and Systems, 2000. May 28-31, 2000. Geneva, Switzerland, vol. 5, pp. 457-460 (2000).

Newton, A.R., et al., "Relaxation based electrical simulation." IEEE Transaction on Computer-Aided Designs of ICs and Systems, vol. CAD-3(4), pp. 30-330. Oct. 1984.

Odabasioglu, A., et al., "PRIMA: Passive Reduced-Order Interconnect Macromodeling Algorithm," Proc. ACM/IEEE ICCAD Nov. 1997, pp. 58-65. San Jose, California.

Phillips, J.R., et al., "Guaranteed passive balancing transformations for model order reduction," Proceedings of $39^{th}$ DAC, pp. 52-57, 2002.

Raghavan, V., et al., "AWESpice: A general tool for the accurate and efficient simulation of interconnect problems," Proceedings of the $29^{th}$ ACM/IEEE conference on Design Automation, pp. 87-92, Jun. 8-12, 1992. Anaheim, California.

Sakallah, K.A., et al., "SAMSON2: an event driven VLSI circuit simulator." IEEE Transactions on Computer-Aided Design of ICs and Systems, vol. 4(4), pp. 668-684. Oct. 1985.

Stojanovic, V. et al., "Adaptive Equalization and Data Recovery in a Dual Mode (PAM2/4) Serial Link Transceiver," 2004 Symposium on VLSI Circuits Digest of Technical Papers, pp. 348-351 (2004).

Stuben, K., "A review of algebraic multigrid," Journal of Computational and Applied Mathematics, vol. 128 (No. 1-2), pp. 281-309 (Mar. 1, 2001). Published in Netherlands.

Stuben, K., "Algebraic Multigrid (AMG): An Introduction with Applications," GMD Report No. 70 (Nov. 1999), 127 pages.

Taylor, S., "The Challenge of Designing Global Signals in UDSM CMOS," IEEE Custom Integrated Circuits Conference, San Diego, CA, pp. 429-435, (1999).

Visweswariah, C., et al., "Piecewise Approximate Circuit Simulation." IEEE Transactions on Computer-Aided Design of ICs and Systems, vol. CAD-10(7), pp. 861-870, Jul. 1991.

Wachspress, et al., "An alternating-direction implicit iteration technique," J. Soc. Ind. and Appl. Match 8: 403-424 (1960).

Wang, K., et al, "Power/ground mesh area optimization using multigrid-based techniques [IC design]," Design, Automation and Test in Europe Conferences and Exhibition, 2003, Santa Barbara, CA, pp. 850-855 (Mar. 3-7, 2003).

White, J., et al., "RELAX2: a new waveform relaxation approach for the analysis of LSI MOS circuits." In Proceedings of the International Symposium on Circuits and Systems (ISCAS), pp. 756-759, vol. 2. May 1983. Newport Beach, California.

Zhao et al., "Frequency domain analysis of switching noise on power supply network," IEEE/ACM International Conference on Computer Aided Design, pp. 487-492, (2000).

Zhao et al., "Hierarchical analysis of power distribution networks," IEEE Transactions on Computer-Aided Design of Integrated Circuits and Systems, vol. 21, No. 2, pp. 159-168, (Feb. 2002).

Zheng et al., "Toward the development of a three-dimensional unconditionally stable finite-difference time domain method," IEEE Tran. Microwave Theory and Techniques, vol. 48, No. 9, (9 pages). Sep. 2000.

Zhu, et al., "Efficient Transient Simulation for Transistor-Level Analysis," EDA Technofair Design Automation Conference Asia and South Pacific Proceedings of the 2005 Conference on Asia South Pacific Design Automation, Shanghai, China (2005) pp. 240-243, published by the ACM, New York, NY, USA.

Zhu, Z., et al., "Power Network Analysis Using an Adaptive Algebraic Multigrid Approach," ACM/IEEE Design Automation Conference, pp. 105-108, Jun. 2-6, 2003. Anaheim, California.

\* cited by examiner

○ UNCONNECTED
⊕ CONNECTED
● ZERO_CONNECTED
⊙ ONE_CONNECTED
⊗ ZERO_UNCONNECTED
⊙ ONE_UNCONNECTED
⊗ ZERO_ONE_UNCONNECTED

▭ UNCONNECTED
▬ ZERO_CONNECTED
▬ ONE_CONNECTED
▬ ZERO_UNCONNECTED
▭ ONE_UNCONNECTED

CIRCUIT SPLITTING IN ANALYSIS OF CIRCUITS AT TRANSISTOR LEVEL

CROSS-REFERENCE TO RELATED PATENT APPLICATION

This application is a national stage application of and claims the benefit of PCT/US2005/020242 filed on Jun. 7, 2005, and is incorporated by reference as part of the specification of this application.

BACKGROUND

This application relates to analysis of integrated circuits.

Circuits may be viewed as networks of nodes and circuit elements connected between nodes. As such, circuits may be analyzed based on a nodal analysis where a nodal equation may be written for each node based on the conservation of charge at the node, i.e., the total current entering the node is equal to the total current leaving the node (the Kirchoff's second rule). For a circuit with N nodes, N equations for the N nodes can be expressed in terms of the properties of circuit elements such as resistance, capacitance, and inductance, and in terms of the node voltages and currents. These N equations can be written into a matrix equation and are solved using various matrix approaches such as LU decompositions.

Integrated circuits with transistors can be simulated using direct methods such as LU decompositions. One example, the Berkeley SPICE2 simulator and its variations use LU decompositions to solve for circuit equations for circuits with transistors. See, Nagal, "Spice2: A computer program to simulate semiconductor circuits," Tech. Rep. ERL M520, Electronics Research Laboratory Report, UC Berkeley (1975). The direct simulation methods may become less effective and can reach their computational limits when the number of transistors and other elements in circuits approaches the capacity limit, e.g., around 50,000 transistors for some direct simulation methods. This is in part because the super linear complexity $O(n^{1.5})$ increases with the number of circuit nodes, n, and the amount of the extracted interconnect data for a large n can exceed the capacity of the software based on a direct simulation method.

SUMMARY

This application describes, among others, a general operator splitting technique for analyzing large-scale integrated circuits to provide ensured convergence and improved simulation speed with high accuracy. The general operator splitting technique can be used to reduce the amount of non-zero fill-ins during the LU factorization. Various implementations of the splitting are described.

In one implementation, a method for analyzing an integrated circuit includes splitting the integrated circuit into two sub circuits which are in or close to tree or forest structures and have a DC path to GND or VDD for each node; and applying a direct matrix inversion method to a circuit matrix equation for each of the two sub circuits to find solutions to the sub circuits. Accordingly, an article is also described to include at least one machine-readable medium that stores machine-executable instructions for the above method. The instructions cause a machine to split the integrated circuit into two sub circuits which are in or close to tree or forest structures and have a DC path to GND or VDD for each node; and apply a direct matrix inversion method to a circuit matrix equation for each of the two sub circuits to find solutions to the sub circuits.

In another implementation, a method for analyzing an integrated circuit is described to represent the integrated circuit with a graph. The graph is divided into two subgraphs that respectively represent two sub circuits of the integrated circuit. In the division process, a resistor is divided evenly between the two subgraphs while a transistor, a transistor device, a capacitor, or an inductor is duplicated in the two subgraphs. Each node of each subgraph has a DC path to GND or VDD. The solutions to the two subgraphs are found for analyzing the integrated circuit. Accordingly, an article is described to include at least one machine-readable medium that stores machine-executable instructions for the above method.

In yet another implementation, an integrated circuit under analysis is represented by a graph. From one or more nodes connected to GND or VDD in the graph, a search for nodes is conducted in the graph. The edges of nodes from the search are divided to form two subgraphs that respectively represent two sub circuits of the integrated circuit. The two subgraphs are modified to ensure each node of each subgraph has a DC path to GND or VDD. The two subgraphs are analyzed to find a solution to the integrated circuit. Accordingly, an article is described to include at least one machine-readable medium that stores machine-executable instructions for the above method.

These and other implementations and their applications are described in greater detail in the attached drawings, the following detailed description, and the claims.

DETAILED DESCRIPTION

Figure 1A:
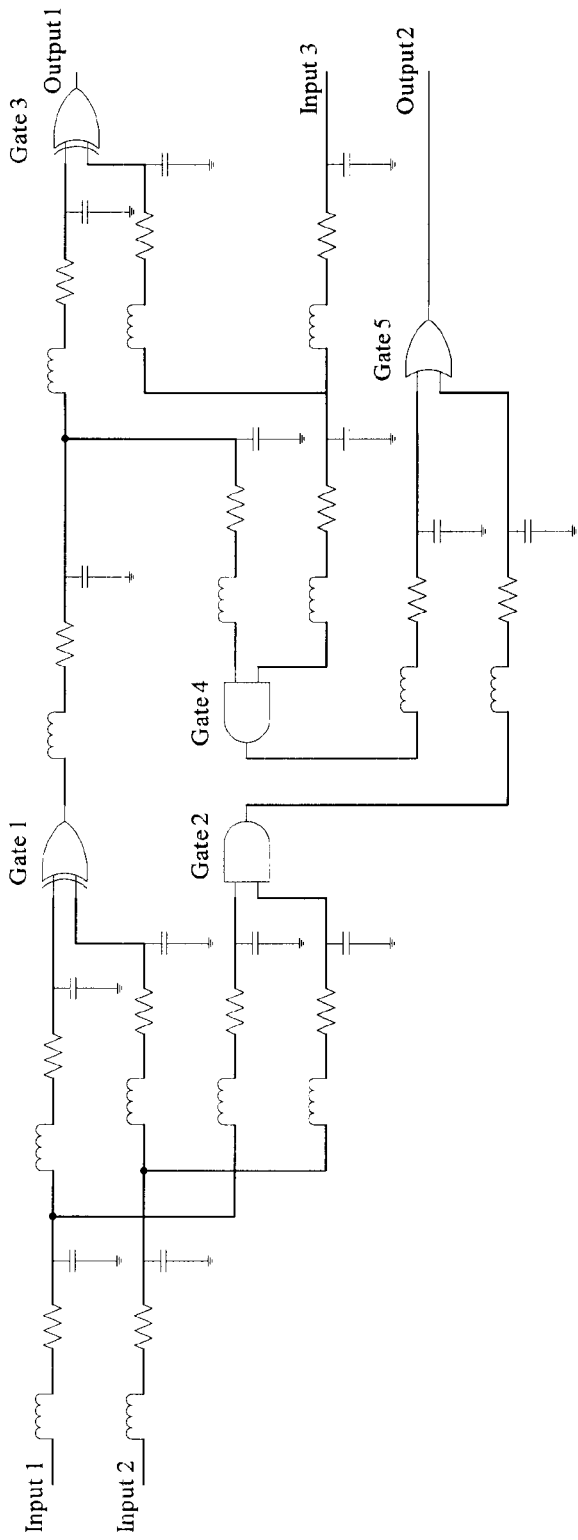
FIGS. 1A and 1B show one example of a simple transistor circuit and its corresponding graph, respectively.

The circuit splitting described here partitions the circuit equation for a complex integrated circuit into two less complicated subcircuits to allow for efficient computations of the circuit equations for the two subcircuits and to provide ensured convergence. The subcircuits have fewer elements than the original circuit. The splitting concept was introduced as a technique for solving partial differential equations. See, e.g., W. F. Ames, "Numerical Methods for Partial Differential Equations," 2nd edition, New York Academic Press (1977). This operator splitting can be illustrated with the following initial value problem (IVP) of a simple ordinary differential equation (ODE), $$\frac{\delta u}{\delta t} = Lu \tag{1}$$

where L is a linear or nonlinear operator and can be written as a linear sum of m suboperators $L_1, L_2, \ldots,$ and $L_m$ of u, $$Lu = L_1 u + L_2 u + \ldots + L_m u \tag{2}$$

Suppose $u_1, u_2, \ldots, u_m$ are updating operators on u with respect to $L_1, L_2, \cdots, L_m$ from time step n to time step n+1, the operator splitting approach has the form of:

$$u^{n+(1/m)} = U_1(u^n, h/m)$$

$$u^{n+(2/m)} = U_2(u^{n+(1/m)}, h/m)$$

$$\ldots$$

$$u^{n+1} = U_m(u^{n+(m-1)/m}, h/m) \quad (3)$$

where each partial operation acts with all the terms of the original operator.

The circuit splitting described here uses the graph theory as the basis to generate a graph representation of an integrated circuit under analysis and then applies a set of partition rules to split the graph for the original circuit into two subgraphs respectively representing two smaller circuits. Circuits nodes are represented by vertices of graphs and circuit connections between different nodes are represented by edges in graphs. This use of the graph based modeling for circuits can be used to provide a generalized splitting algorithm and the generalization removes constraints of the geometry or locality of circuits under analysis. Notably, this approach is unconditionally stable and hence essentially eliminates the convergence issues in many direct methods for simulating large and complex circuits such as the LU decompositions.

The following sections use a general circuit system to describe the circuit operator splitting method. It is assumed that the circuit includes resistors, capacitors, and inductors with mutual couplings. For linear circuits, the nodal analysis using Backward Euler Integration can be expressed as below:

$$\begin{bmatrix} \frac{C}{h} + G & -A^T \\ A & \frac{L}{h} + R \end{bmatrix} \begin{bmatrix} V(t+h) \\ I(t+h) \end{bmatrix} = \begin{bmatrix} \frac{C}{h} & 0 \\ 0 & \frac{L}{h} \end{bmatrix} \begin{bmatrix} V(t) \\ I(t) \end{bmatrix} + U(t+h) \quad (4)$$

where C, L, R, G are the matrices of capacitances, inductances, resistances, and conductances, respectively; the matrix A is an incidence matrix linking between the topology of capacitance nodes and inductance branches; the vectors V, I, and U describe the voltages of capacitance nodes, currents of inductance branches, and system inputs, respectively. The scalar h is the time step from time t to time (t+h). Note that the four matrices, C, L, R, and G, are symmetric by construction and are positive semidefinite because the circuit elements such as capacitances, inductances, resistances, and conductances are non-active. In addition, matrices C and L are assumed to be positive definite for a nondegenerated case.

The circuit represented by Equation (4) can be partitioned into any two arbitrary subcircuits. The corresponding two partitions of matrices A, R, and G can be written as:

$$A = -A_1 + A_2,$$

$$R = R_1 + R_2 \text{ and}$$

$$G = G_1 + G_2.$$

By construction, the matrices Ri and Gi for $i \in \{1,2\}$ are symmetric and positive semidefinite. Following the circuit partition, the integration in Equation (4) is divided into two half steps and alternates the forward and backward integrations between the partitions as follows:

$$\begin{cases} \begin{bmatrix} \frac{2C}{h} + G_1 & -A_1^T \\ A_1 & \frac{2L}{h} + R_1 \end{bmatrix} \begin{bmatrix} V\left(t + \frac{h}{2}\right) \\ I\left(t + \frac{h}{2}\right) \end{bmatrix} = \begin{bmatrix} \frac{2C}{h} - G_2 & A_2^T \\ -A_2 & \frac{2L}{h} - R_2 \end{bmatrix} \begin{bmatrix} V(t) \\ I(t) \end{bmatrix} + U\left(t + \frac{h}{2}\right) \\ \begin{bmatrix} \frac{2C}{h} + G_2 & -A_2^T \\ A_2 & \frac{2L}{h} + R_2 \end{bmatrix} \begin{bmatrix} V(t+h) \\ I(t+h) \end{bmatrix} = \begin{bmatrix} \frac{2C}{h} - G_1 & A_1^T \\ -A_1 & \frac{2L}{h} - R_1 \end{bmatrix} \begin{bmatrix} V\left(t + \frac{h}{2}\right) \\ I\left(t + \frac{h}{2}\right) \end{bmatrix} + U(t+h) \end{cases} \quad (5)$$

In the first half step, the forward integration is used for the subcircuit with matrices $A_2$, $G_2$ and $R_2$. Then, in the second half step, the forward integration is used for the subcircuit with matrices $A_1$, $G_1$ and $R_1$. In both half steps, the other partition is integrated by the backward implicit integration.

If the two left-hand-side matrices in the two equations in the formulation (5) correspond to trees or forest structures, a direct matrix inversion can be used to efficiently solve those two equations because there is no nonzero fill-ins and the computational cost is linearly proportional to the number of elements. Define notations P1, P2 and S as follows:

$$P_1 = \begin{bmatrix} G_1 & -A_1^T \\ A_1 & R_1 \end{bmatrix},$$

$$P_2 = \begin{bmatrix} G_2 & -A_2^T \\ A_2 & R_2 \end{bmatrix}, \text{ and,}$$

$$S = \begin{bmatrix} \frac{2C}{h} & 0 \\ 0 & \frac{2L}{h} \end{bmatrix}.$$

The two equations for the two half steps of the operator splitting formulation (5) can be simplified as:

$$\begin{cases} (P_1 + S)X\left(t + \frac{h}{2}\right) = -(P_2 - S)X(t) + U\left(t + \frac{h}{2}\right) \\ (P_2 + S)X(t+h) = -(P_1 - S)X\left(t + \frac{h}{2}\right) + U(t+h) \end{cases} \quad (6)$$

where $X = \begin{bmatrix} V \\ I \end{bmatrix}$.

The above operator splitting formulation allows for arbitrary splitting of a circuit. The present technique applies a set of splitting rules to ensure more efficient processing of the two partitions and the original circuit. Such splitting rules are in part based on the recognition that the performance of direct methods such as LU decomposition can still beat iterative methods for small circuits with up to tens of thousands of nodes and direct methods become prohibitive for large circuits due to the order of $O(n^{1.1})$ to $O(n^{1.5})$ nonzero fill-ins, where n is the number of nodes in circuits. In addition, it is also known that the LU decomposition method does not create non-zero fill-ins for circuits in tree/forest structure if nodes elimination always selects from leaves of the graph. This elimination order can be captured by ordering algorithms based on minimum degrees (i.e., the number of neighboring nodes for a particular node).

Following this observation, the present operator splitting algorithm splits a circuit into two partitions with structures close to tree or forest such that the number of non-zero fill-ins is minimized. The partition is carried out in two steps: graph representation of the circuit and application of the splitting rules to form two sub graphs.

In the implementations described here, a circuit structure can be represented by an undirected graph. The edges in the undirected graph are divided into two sub-graphs using the graph theory. An undirected graph $G=(V, E)$ is used to represent the circuit structure.

In order to ensure the DC convergence of the two partitions, every node in both partitions has a DC path to GND or VDD. This is one of the rules of the present splitting algorithm. As an example, because each capacitor is a circuit break point in a DC path, there cannot a node between two capacitors. In addition, only resistive connections are split and resistors are divided into two partitions using graph theory algorithms. Capacitors and inductors are not divided so that each partition has a full version of each capacitor or inductor. When solving each partition, the rest of circuit are modeled as equivalent current sources, following the operator splitting formulation (5) or (6). In many digital circuits, transistors are often grouped as various gates. Taking into consideration the non-linear property of transistor devices and gates, a single transistor or gate is not split into different partitions; instead each partition has a full-version of all transistor devices. Accordingly, transistor devices are treated like capacitors and inductors and thus are duplicated in each partition and are solved at every half time point. Hence, the present splitting algorithm divides each resistor branch into two partitions and each partition has a full-version of transistor devices, capacitors and inductors. Circuit nodes can be classified as super nodes and branch nodes in the graph for the circuit. A super node denotes the end point of resistors in large linear networks or a single resistor. Branch node represents the end point of resistors on signal wires connecting gates in the circuit. The edge denotes the resistor branch in the circuit since only resistors are divided into partitions. End points of resisters on signal wires and large linear networks (e.g., a power network) are different. Only end points on signal wires are considered as branch nodes. With the transistor duplication strategy, each gate is represented by a super node in the graph and the detail inside each gate is invisible to the splitting algorithm. The resistors connection points in the circuit are represented by a branch node in the graph. Each edge $e_{ij}$ between nodes $v_i$ and $v_j$ in the graph represents a corresponding connection in the circuit.

Figure 1B:
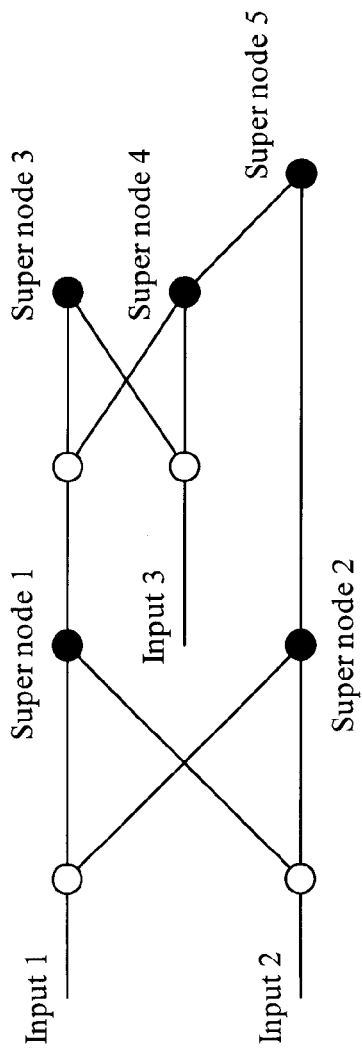
Figure 2A:
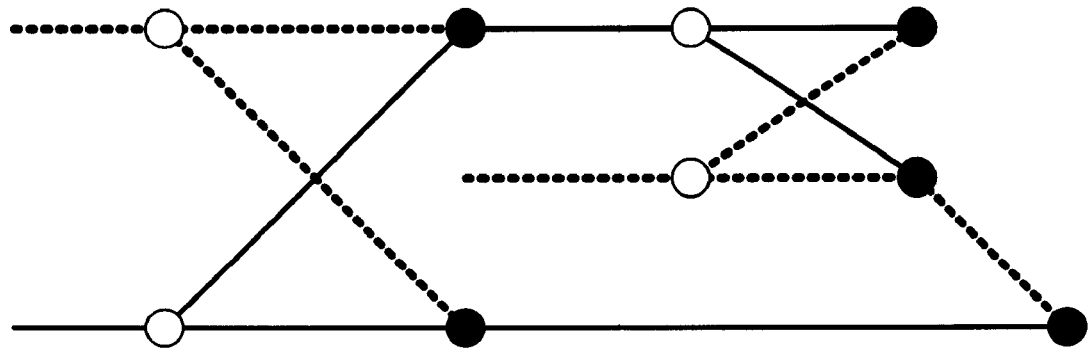
FIGS. 2A, 2B and 2C illustrate one example of the splitting of the circuit in FIG. 1A according to one implementation.
Figure 2B:
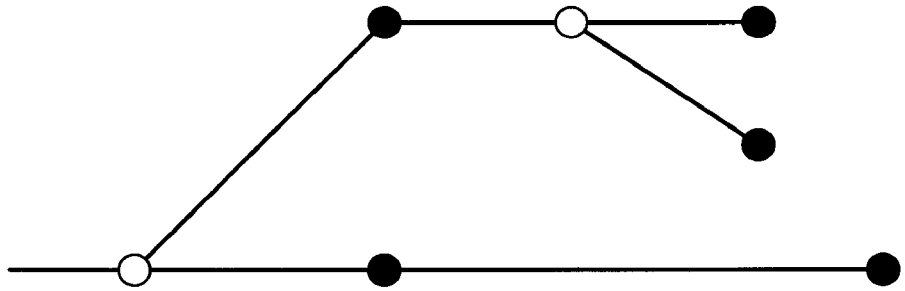
Figure 2C:
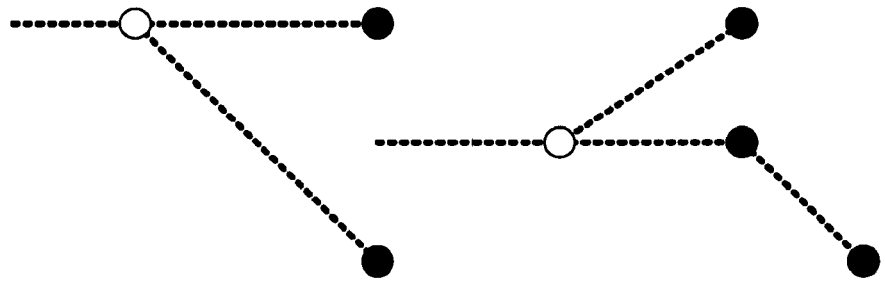

FIG. 1A shows a simple transistor circuit with three inputs and two outputs. FIG. 1B shows the corresponding undirected graph representation of the circuit in FIG. 1A. The five super nodes in solid dots represent five gates in the circuit respectively and four branch nodes in hollow dots represent the resistive connections in the circuit. The outputs are omitted. FIG. 2A shows one possible splitting configuration of the graph in FIG. 1B where dashed lines and solid lines denote two different partitions. FIG. 2B shows the sub graph of the solid lines in FIG. 2A and FIG. 2C shows the sub graph of the dashed lines in FIG. 2A.

The splitting algorithm is applied to divide the graph into two sub-graphs. Each sub-graph represents a sub-circuit and corresponds to a sub-matrix in circuit simulation process. The number of non-zero fill-ins of the matrix LU decomposition is to be as small as possible during the partition so that the sum of the number of non-zero fill-ins of two sub-matrices is much less than the number of non-zero fill-ins of the original full matrix. To achieve this, the rules for splitting the graph are designed to decrease the degree (the number of neighbors) of every node in both sub-graphs compared with the degree in the original undirected graph. In the matrix LU decomposition, non-zero fill-ins are introduced among neighbors of a node when the node is eliminated and as such the non-zero fill-ins increase dramatically as the elimination progresses and eventually render the LU decomposition impractical for solving circuits with a large number of nodes. The present splitting algorithm minimizes the degree of every node in sub-graphs and thus reduces the number of non-zero fill-ins.

In addition to the above rules on the DC paths, resistors, inductors, capacitors, and transistors, the following rules are applied for the splitting process.

(1) Branch rule: the edges in one branch belong to the same partition. For example, signal wires connecting gates are assigned to one partition. In the undirected graph, one branch includes the edges connected by branch nodes. If one branch is broken into two partitions, the broken branch node could cause undesired iterations during simulation.

(2) Degree rule: the edges of a node whose degree is two belong to the same partition. The line structure wouldn't cause many non-zero fill-ins and it will be propitious to provide the DC path in the sub-graphs.

(3) Loop rule: the loop is to be avoided in each sub-graph if possible. Loops in the sub-graphs can potentially introduce non-zero fill-ins and thus should be avoided or minimized if possible.

(4) Balance rule: the edges for each node in the graph are to be divided into two sub-graphs.

Application of the above splitting rules may render the partition of a circuit not optimized due to its structure limitation or the restriction of DC paths (no floating nodes is allowed at DC stage). However, the number of overall non-zero fill-ins can still be greatly reduced for most circuits in comparison with the number of non-zero fill-ins due to the direct methods. In addition, the present splitting ensures the stability of the computation based on the splitting.

Figure 3:
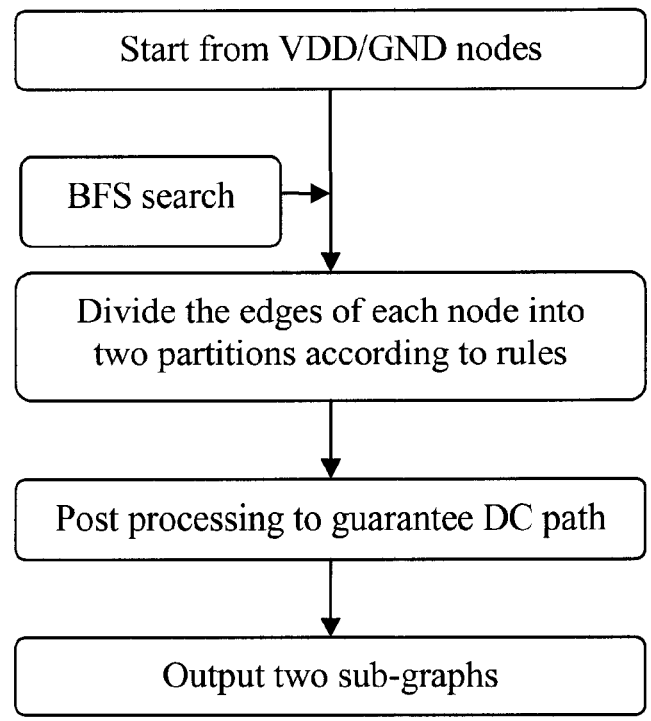
FIG. 3 illustrates one implementation of the splitting process.

FIG. 3 shows one implementation of the splitting algorithm. First, a circuit under analysis is represented by a corresponding undirected graph of super nodes and branch nodes where the VDD and GND nodes are identified. Next, a breadth first search (BFS) is performed beginning at the identified VDD and GND nodes to discover all nodes in the graph. Splitting rules are applied to divide edges of each node of the graph into two partitions. A DC path post processing is then performed to modify the partitions in order to ensure a DC path for each node in the two sub graphs. The final result is two sub-graphs, which correspond to two sub-circuits.

In the BFS partition stage, the search may begin from VDD/GND nodes simultaneously to go through all the nodes in the graph using BFS and to divide the edges of every node into two partitions according to the partition rules. In order to facilitate the post processing, each of the nodes and edges is associated with a label to record the status of partition and DC path to VDD/GND. Based on the labeling information, the partition rules are applied to benefit the DC path available for all the nodes in sub-graphs.

In the post processing stage, the partition for the edges without a DC path to VDD/GND is adjusted or modified.

According to the labels, the partition status for all the edges and nodes is identified to indicate which partition each edge or node belongs to and whether each edge or node has a DC path to VDD/GND in that partition. From a global view of the BFS partition result, some parts of the graph would have DC paths while other parts of the graph may not have a DC path. Therefore, there are boundary nodes between a part with DC paths and another adjacent part without a DC path. The post processing is to extend or "grow" an existing DC path from a boundary node for the edges and nodes without a DC path upon the partition. For example, if an edge does not have a DC path in the partition assigned to it while one of its connecting nodes has a DC path in another partition, the partition for this edge can be changed to provide a DC path. After the change in the partition, the labels for the corresponding nodes and edges are updated and the DC path may be propagated to some other edges without a DC path. In the final splitting result, a DC path is made available for all the nodes in both sub-graphs.

Figure 4A:
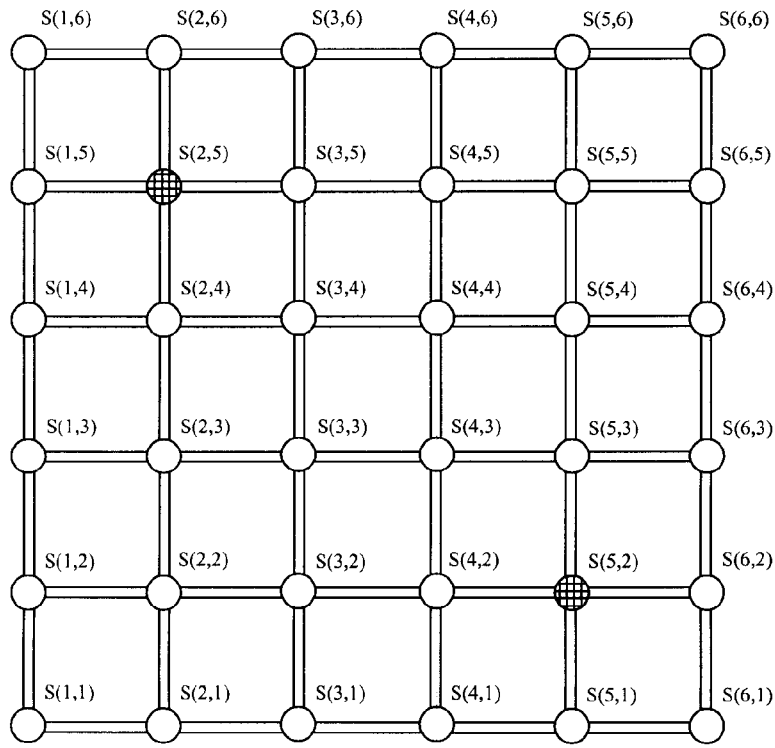
FIGS. 4A, 4B, 4C, 4D, 4E, 4F and 4G show a step-by-step illustration of the application of the splitting in FIG. 3 for a simple 6×6 mesh transistor circuit.

FIGS. 4A through 4G illustrate an example of the above splitting algorithm for a simple circuit shown by a mesh graph in FIG. 4A. Node and edge labels are defined in the insert of FIG. 4B to include CONNECTED, UNCONNECTED, ZERO_UNCONNECTED, ONE_UNCONNECTED, ZERO_ONE_UNCONNECTED, ZERO_CONNECTED and ONE_CONNECTED, where "ZERO" and "ONE" represent two sub-graphs due to the splitting. The label's name describes the status of partition and DC path for the node. A node is "connected" when it is connected to a GND or VDD. Hence, the label "ZERO_UNCONNECTED" for a node means that the node has an edge in the sub-graph ZERO without a DC path. Other labels are self explanatory.

Figure 4B:
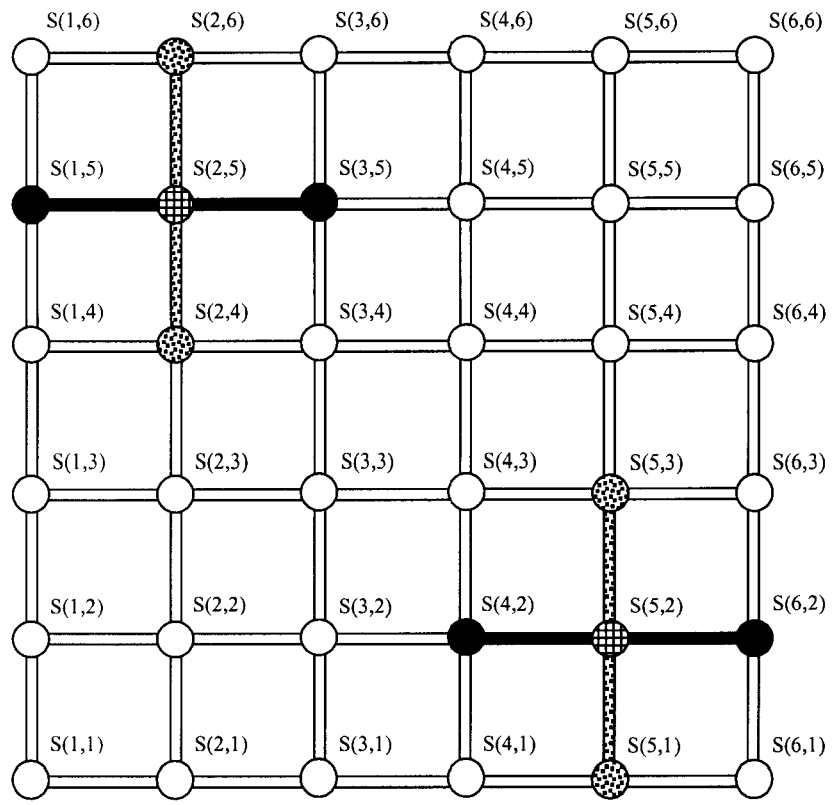

FIG. 4A shows the input undirected 6×6 mesh graph for a circuit where there are two VDD/GND nodes S(2,5) and S(5,2) and all nodes are assumed to be super nodes. FIGS. 4B-4F show the stepwise changes of splitting status for all the nodes and edges in the BFS partition stage. FIG. 4B shows the first step of the BFS process which starts from the VDD/GND nodes S(2,5) and S(5,2). The edges of nodes S(2,5) and S(5,2) are divided into two partitions evenly according to the balance rule. The labels for the edges and its neighbors also are updated at the end of the first step of the BFS partition.

Figure 4C:
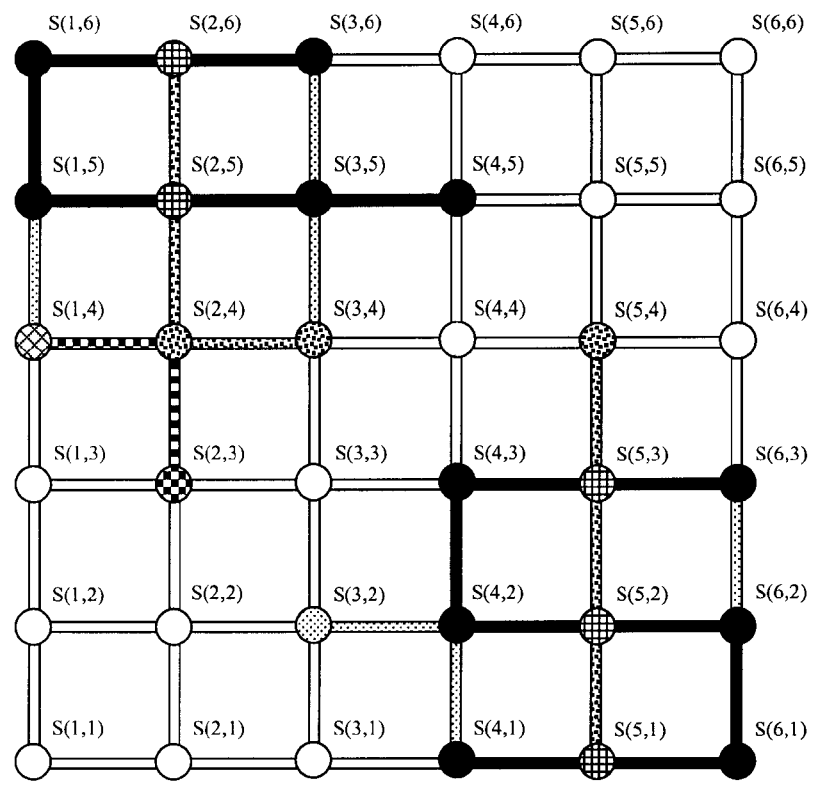

Next, the edges for the nodes S(1,5), S(2,6), S(3,5), S(2,4), S(4,2), S(5,3), S(6,2) and S(5,1) are divided. The edges of nodes S(1,6) and S(6,1) belong to the same partition according to the degree rule. The edge between nodes S(3,5) and S(3,6) are assigned partition to avoid loop according to the loop rule. The result of these operations is shown in FIG. 4C.

Figure 4D:
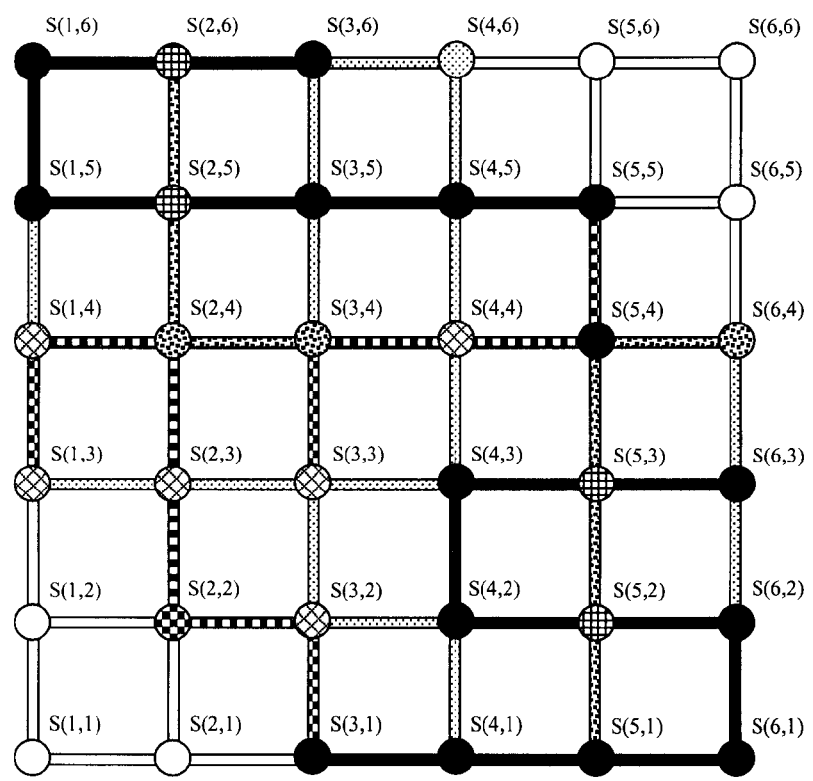
Figure 4E:
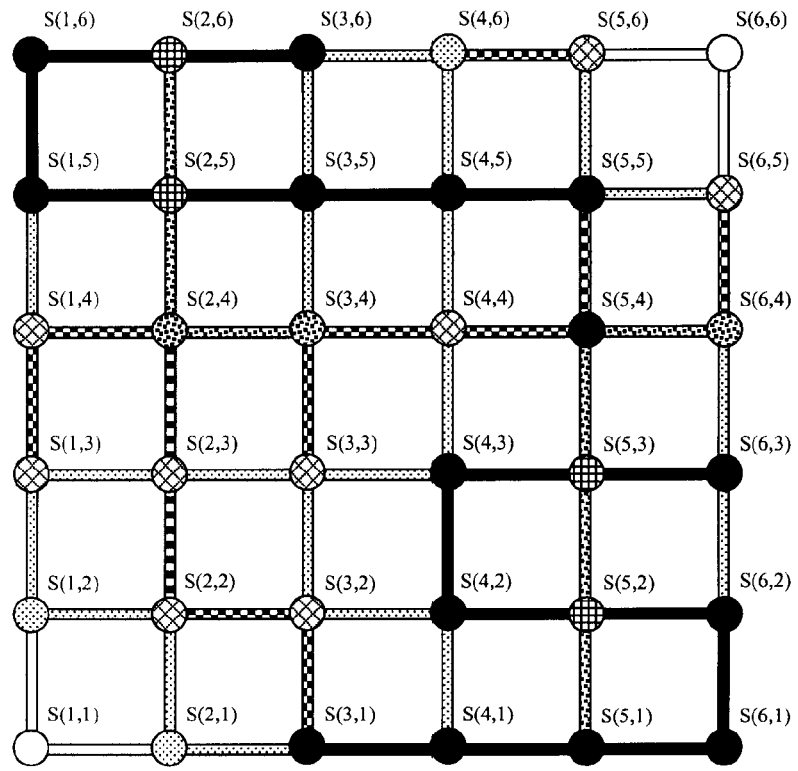
Figure 4F:
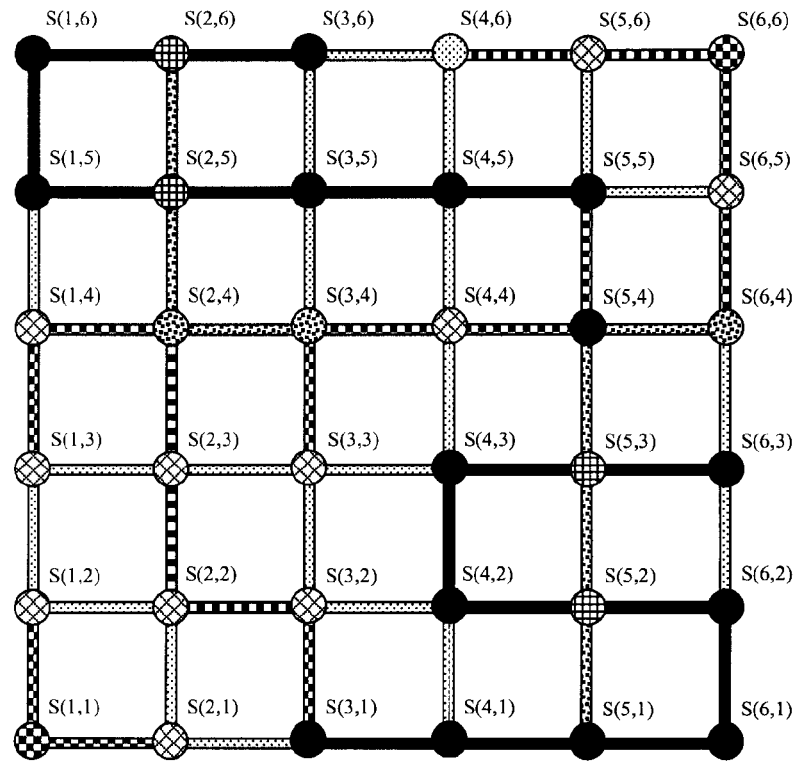

FIG. 4D shows additional edges are divided into two partitions based on the rules. The edges far away from the input VDD/GND nodes S(2,5) and S(5,2) are more likely to have no DC path. Six nodes remain unconnected at this time. FIG. 4E shows that the edges of six unconnected nodes S(1,3), S(2,2), S(3,1), S(4,6), S(5,5) and S(6,4) in FIG. 4D are processed and only two nodes S(1,1) and S(6,6) are left unconnected. The BFS partition continues to the remaining two nodes S(1,1) and S(6,6). FIG. 4F shows the final partition result of the BFS partition stage. There are 32 edges and 28 edges in the two partitions, respectively, where 23 edges have DC paths in their partition while 37 edges do not have DC paths.

Figure 4G:
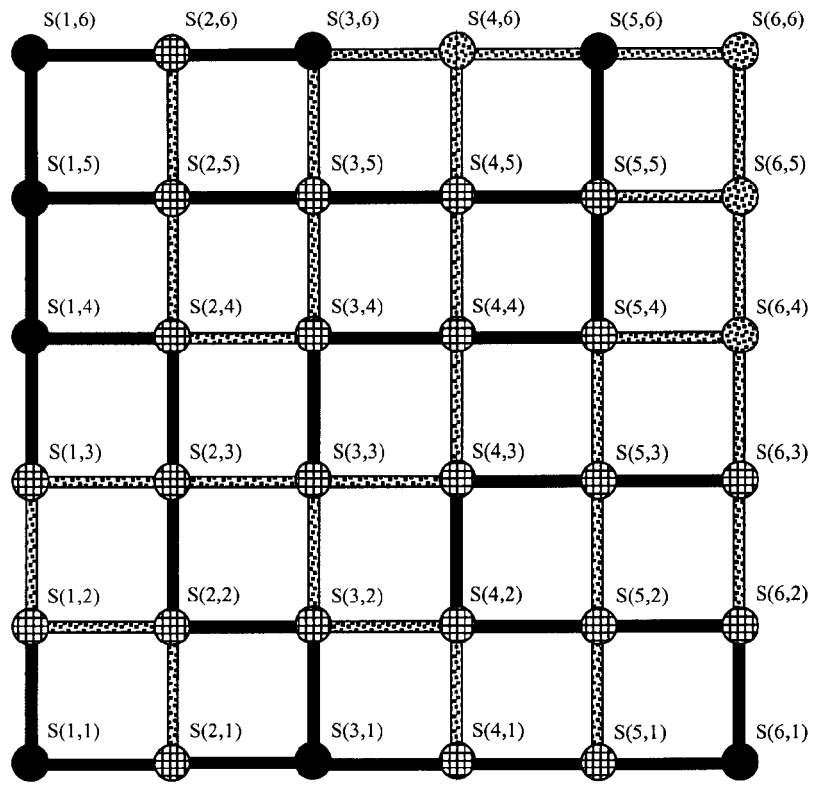

Next, the post processing is performed to modify the partition to ensure the DC paths for all edges. FIG. 4G shows the final partition result after the post processing. Both sub-graphs in the final result have a tree/forest structure and there are 31 and 29 edges in the two partitions, respectively. The tree/forest structure greatly benefits the LU decomposition operations in the subsequent circuit simulation.

The above splitting algorithm can be shown be unconditionally stable. For the analysis of the error propagation, the inputs in the operator splitting formulation (5) can be ignored. The two half steps can be combined and reduced to a recursive formula:

$$X_{(k+1)} = \Lambda X_{(k)} \quad (7)$$

where $\Lambda = (P_2+S)^{-1}(P_1-S)(P_1+S)^{-1}(P_2-S)$. In proof of the convergence, the norm as follows is used:

$$\|\chi\|_{S^{-1}} = (\chi^T S^{-1} \chi)^{1/2}.$$

The matrix $S^{-1}$ is positive definite because the matrix S is positive definite and the inverse of a positive definite matrix remains to be positive definite. The following sections first state the theorem of the unconditional stability and then provide the proof of the statement by lemmas which follow the theorem.

Theorem 3.1: The operator splitting formula (5) is stable independent of the step size h.

Proof: Let $\rho(\Lambda) = \max(|\lambda_i(\Lambda)|)$, where $\lambda_i(\Lambda)$ is the $i^{th}$ eigenvalue of matrix $\Lambda$. The proposed operator splitting approach is stable if $\rho(\Lambda) <= 1$.

From Lemma 3.4, we have the following $$\|(P_1-S)(P_1+S)^{-1}\chi\|_{S^{-1}} \leq \|\chi\|_{S^{-1}} \text{ and}$$

$$\|(P_2-S)(P_2+S)^{-1}\chi\|_{S^{-1}} \leq \|\chi\|_{S^{-1}}.$$

Let $\rho(\tilde{\Lambda}) = (P_1-S)(P_1+S)^{-1}(P_2-S)(P_2+S)^{-1}$
From Lemma 3.2 and 3.3, we can deduce: $\rho(\Lambda) = \rho(\tilde{\Lambda}) \leq 1$
Lemma 3.2:

$$\rho((P_2+S)^{-1}(P_1-S)(P_1+S)^{-1}(P_2-S)) = \rho((P_1-S)(P_1+S)^{-1}(P_2-S)(P_2+S)^{-1})$$

Proof: It can be derived that $\rho(AB) = \rho(BA)$ if matrix A or B is nonsingular. Thus, the lemma can be proven by setting $A = (P_2+S)^{-1}$ and $B = (P_1-S)(P_1+S)^{-1}(P_2-S)$.

Lemma 3.3: Given a real matrix M, if $\|M\chi\|_{S^{-1}} \leq \gamma \|\chi\|_{S^{-1}}$, for all real $\chi$, then $\rho(M) \leq \gamma$.

The proof can be found in E. L. Wachspress and G. J. Habetler, "An alternating-direction-implicit iteration technique," J. Soc. Ind. and Appl. Math. 8, 403-424 (1960).

Lemma 3.4: $\|(P_i-S)(P_i+S)^{-1}\chi\|_{S^{-1}}^2 \leq \|\chi\|_{S^{-1}}^2$ for $i \in \{1,2\}$ and every real vector $\chi$.

Proof: $\|(P_i-S)(P_i+S)^{-1}\chi\|_{S^{-1}}^2 \leq \|\chi\|_{S^{-1}}^2$ is equivalent to $\|(P_i-S)(P_i+S)^{-1}\chi\|_{S^{-1}}^2 \leq \|\chi\|_{S^{-1}}^2$ where $y = (P_i+s)^{-1}\chi$ We expand the inequality expression according to the definition of the norm.

$$y^T(P_i^T - S^T)S^{-1}(P_i - S)y \leq y^T(P_i^T + S^T)S^{-1}(P_i + S)y \quad (8)$$

We expand the product terms and cancel the common items on the two sides of the inequality. The expression is reduced to:

$$y(P_i + P_i^T)y^T \geq 0 \quad (9)$$

which is true since $P_i + P_i^T$ is positive semidefinite for $i \in \{1,2\}$.

Though the general operator splitting approach is A-stable, the local truncation error still needs to be controlled below the error tolerance in order to ensure the accuracy. By estimating the local truncation error at each time point, we can dynamically adjust the time step to control the local truncation error.

Consider the system equation before the numerical integration, $$\begin{bmatrix} C & 0 \\ 0 & L \end{bmatrix} \begin{bmatrix} \dot{V}(t) \\ \dot{I}(t) \end{bmatrix} = \begin{bmatrix} -G & A^T \\ -A & -R \end{bmatrix} \begin{bmatrix} V(t) \\ I(t) \end{bmatrix} + U(t) \quad (10)$$

Let $$M = \begin{bmatrix} C & 0 \\ 0 & L \end{bmatrix}, N = \begin{bmatrix} -G & A^T \\ -A & -R \end{bmatrix}$$

and ignore the input vector U. Equation (10) can be simplified as:

$$M\dot{X} = NX$$

$$\dot{X} = M^{-1}NX \quad (11)$$

The exact analytic solution x with time step h can be derived as below:

$$X_{n+1} = e^{M^{-1}Nh} X_n \quad (12)$$

$$= \left(1 + M^{-1}Nh + \frac{h^2(M^{-1}N)^2}{2} + \frac{h^3(M^{-1}N)^3}{6} + O(h^4)\right) X_n$$

The general operator splitting approach can also be formulated as:

$$\frac{M}{h}(\hat{X}_{n+1} - X_n) = N_1 \hat{X}_{n+1} + N_2 X_n \quad (13)$$

where $N = N_1 + N_2$, $N_1$ represents the partition applied Backward Euler and $N_1$ denotes the partition applied forward Euler integration method.

The analytic solution of operator splitting approach is derived as below:

$$\left(\frac{M}{h} - N_1\right)\hat{X}_{n+1} = \left(\frac{M}{h} + N_2\right) X_n \quad (14)$$

$$\hat{X}_{n+1} = [I + hM^{-1}N + h^2 M^{-1} N_1 M^{-1} N + O(h^3)] X_n \quad (15)$$

The local truncation error (LTE) is the difference of operator splitting solution and exact solution x:

$$LTE = \left\| h^2 M^{-1}\left(\frac{N}{2} - N_1\right)\dot{X}_n + O(h^3) \right\| \quad (16)$$

The local truncation error at each time step should not exceed the error tolerance. If the high order terms of local truncation error are ignored, the time step when forward Euler integration is applied to partition corresponding to $N_1$ can be estimated as:

$$h_1 < \sqrt{\frac{ErrorTolerance}{\left\| M^{-1}\left(\frac{N}{2} - N_1\right)\dot{X}_n \right\|}} \quad (17)$$

Similarly, the time step when forward Euler integration is applied to partition corresponding to $N_2$ is estimated as:

$$h_2 < \sqrt{\frac{ErrorTolerance}{\left\| M^{-1}\left(\frac{N}{2} - N_2\right)\dot{X}_n \right\|}} \quad (18)$$

The new time step h is twice of the minimum time step of each partition:

$$h = 2 \min(h_1, h_2) \quad (19)$$

The above splitting algorithm was implemented in C programming language and tested against Berkeley SPICE3 using BSIM3 models for transistor devices. Convergence and accuracy are guaranteed. Examples were tested on a Linux machine with 2.6 GHz CPU and 4 Gigabytes memory.

Figure 5A:
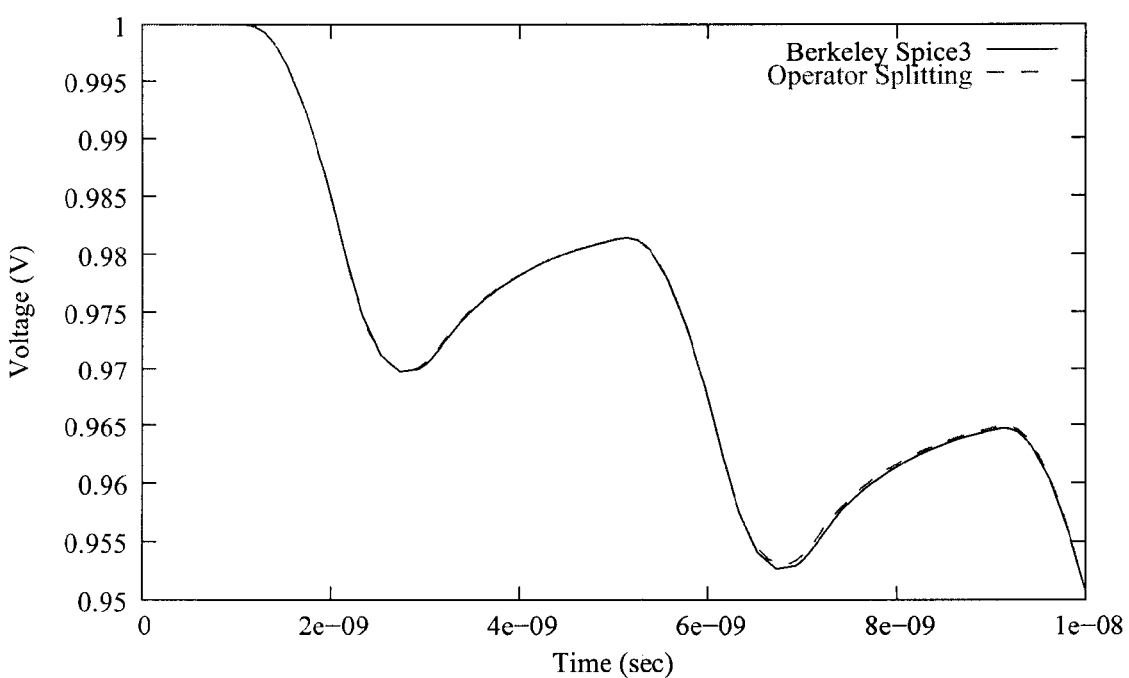
FIGS. 5A, 5B, 5C and 5D show simulation results using the present splitting technique.

A number of RLC power networks with nonlinear current sinks ranging from 11 k nodes to 160 k nodes were tested. Various transistor gates draw current from the power networks. Those power networks are approximately in mesh structures. The splitting algorithm results in very limited non-zero fill-ins and the linear runtime of the splitting algorithm was. The CPU runtime and speedup are given in Table I. One or two orders of magnitude speedup (8.1× to 58.2×) against SPICE3 is obtained. The transient waveform circuit3 is given in FIG. 5A. The tests only replaced the LU decomposition procedure inside the SPICE3, other overhead such as device evaluation and dynamic time step control took more than 30% of the total runtime and therefore limited the overall speedup during our tests.

Figure 5B:
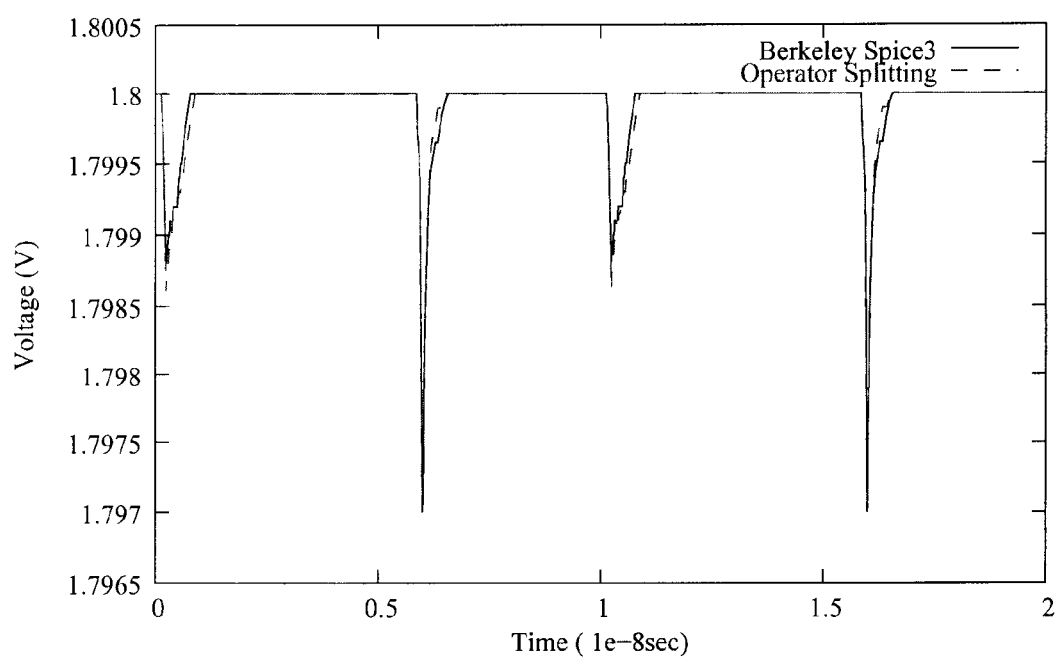

The power and clock network tests were done for an RLC power ground network and a two-level H-tree clock. FIG. 5B shows the voltage drop at one node of the power network. Transient simulation of 10 ns is completed in 649.5 seconds, which is 18.5 times faster than SPICE3 as shown in Table I.

Figure 5C:
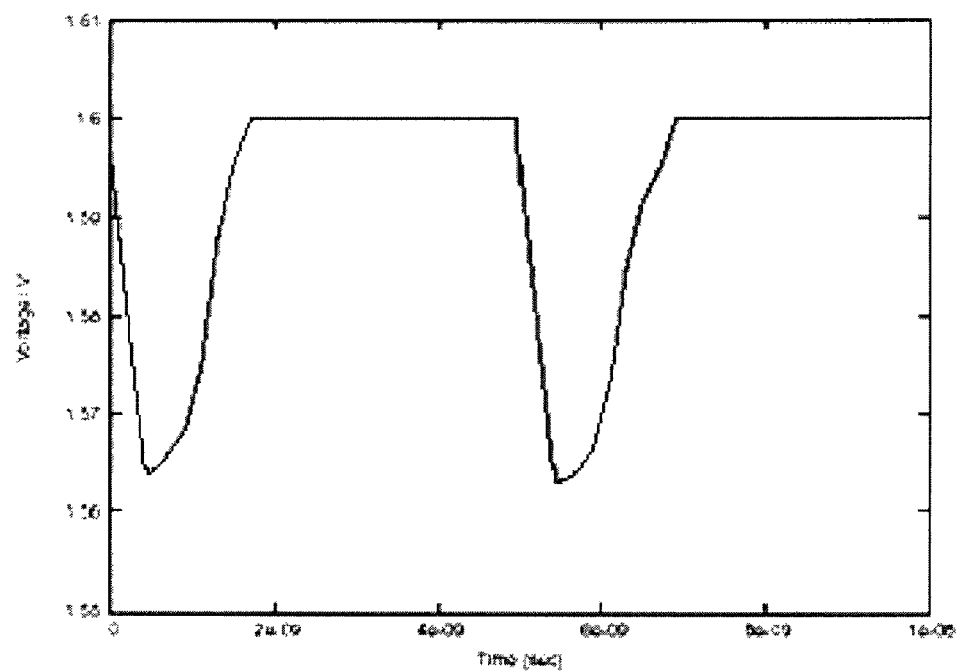

A large RC power network with 0.6 million nodes and an irregular structure was also tested where some nodes have thousands of neighbors. The switching activities that draw current from the power network were modeled as piecewise linear current waveform. Berkeley SPICE3 failed to execute because of the memory size and computation time problem. The operator splitting approach finished the transient analysis of 10 ns in just 4083 seconds. FIG. 5C illustrates the voltage drop of a node on the power network.

Figure 5D:
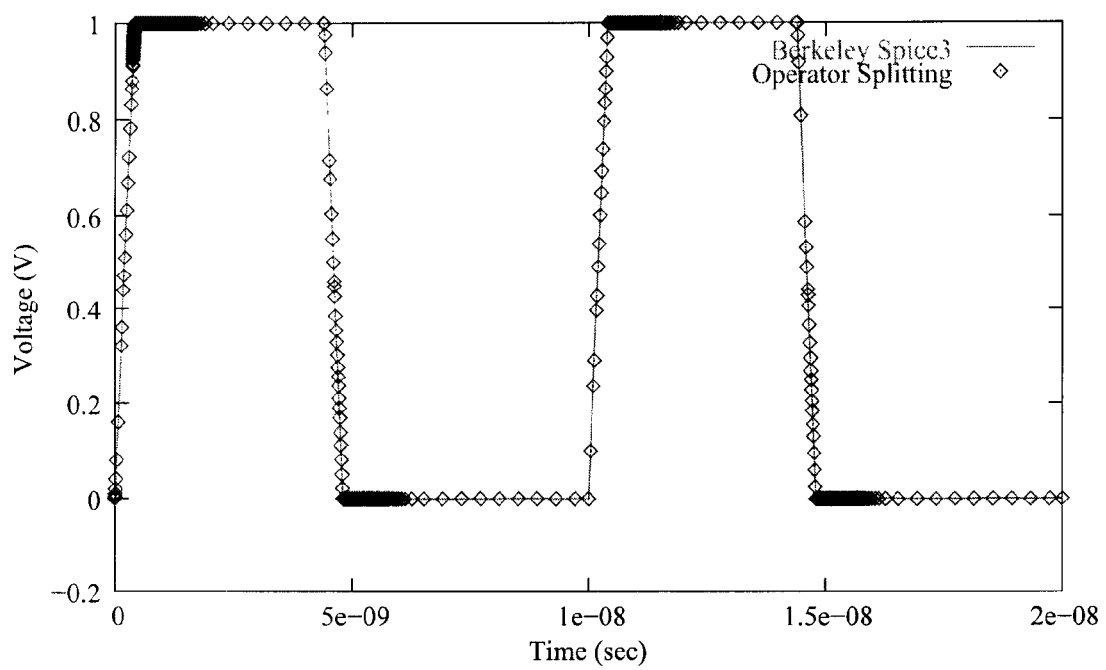

Two 1K and 10K cells ASIC designs were also tested to demonstrate the splitting algorithm's ability of handling transistor dominated nonlinear circuits. The 1 k cell circuit had 10,200 nodes and 6,500 transistors. The 10 k cell circuit had 123,600 nodes and 69,000 transistors. It was assumed that ideal power and ground supply were provided in those RC examples. The splitting algorithm took 415.9 seconds for the 1K cell circuit and 3954.7 seconds for the 10K cell circuit to finish 20-ns transient simulations. The speedup over SPICE3 is 5.1× and 11.2× for these two examples (Table I). Accurate waveform match was observed for those two examples. FIG. 5D shows the transient waveform of one gate output in the 1K cell design.

TABLE I

TRANSIENT SIMULATION RUNTIME

| Examples | circuit1 | circuit2 | circuit3 | circuit4 | Power and Clock Network | Large Power Network | 1K-cell | 10K-cell |
|---|---|---|---|---|---|---|---|---|
| #Nodes | 11,203 | 41,321 | 92,360 | 160,657 | 29,100 | 615,446 | 10,200 | 123,600 |
| #Transistors | 74 | 512 | 1,108 | 2,130 | 720 | 0 | 6,500 | 69,000 |
| Simulation Period | 10 ns | 10 ns | 10 ns | 10 ns | 10 ns | 10 ns | 20 ns | 20 ns |
| SPICE3 (sec) | 602.44 | 8268.92 | 39612.32 | N/A | 12015 | N/A | 2121 | 44293 |
| Operator Splitting (sec) | 74.64 | 305.38 | 681.18 | 1356.21 | 649.5 | 4083.7 | 415.9 | 3954.7 |
| Speedup | 8.1x | 27.1x | 58.2x | N/A | 18.5x | N/A | 5.1x | 11.2x |

In implementations, the above described techniques and their variations may be implemented as computer software instructions. Such software instructions may be stored in an article with one or more machine-readable storage media that are not connected to a computer, or stored in one or more machine-readable storage devices connected to one or more computers either directly or via a communication link. In operation, the instructions are executed by, e.g., one or more computer processors, to cause the machine to perform the described functions and operations for circuit analysis.

Only a few implementations are disclosed. However, it is understood that variations and enhancements may be made.

What is claimed is:

1. A method for analyzing an integrated circuit, comprising:
   representing the integrated circuit with an undirected graph;
   from one or more nodes connected to GND or VDD in the graph, conducting a search, using a processor, for nodes in the undirected graph;
   dividing edges of nodes from the search to form exactly two subgraphs that respectively represent two sub circuits of the integrated circuit;
   modifying the divided two subgraphs to ensure each node of each subgraph to have a DC path to GND or VDD; and
   analyzing, using the processor, the two subgraphs.

2. The method as in claim 1, wherein a capacitor is not divided between the two subgraphs and is duplicated in the two subgraphs.

3. The method as in claim 1, wherein an inductor is not divided between the two subgraphs and is duplicated in the two subgraphs.

4. The method as in claim 1, wherein a transistor is not divided between the two subgraphs and is duplicated in the two subgraphs.

5. The method as in claim 1, wherein a gate having a plurality of transistors is not divided between the two subgraphs and is duplicated in the two subgraphs.

6. The method as in claim 1, wherein edges in one branch are assigned to the same subgraph.

7. The method as in claim 1, wherein edges of a node whose degree is two are assigned to the same subgraph.

8. The method as in claim 1, wherein each subgraph is free of a loop.

9. The method as in claim 1, wherein a number of loops for nodes in each subgraph is minimized.

10. The method as in claim 1, wherein resistors of the integrated circuit are evenly divided between the two subgraphs.

11. The method as in claim 1, further comprising applying a direct matrix conversion method to analyze each of the two subgraphs.

12. The method as in claim 1, wherein the search is a breadth first search.

13. An article comprising at least one non-transitory machine-readable medium that stores machine-executable instructions, the instructions causing a machine to:
   represent the integrated circuit with an undirected graph;
   from one or more nodes connected to GND or VDD in the graph, conduct a search for nodes in the undirected graph;
   divide edges of nodes from the search to form exactly two subgraphs that respectively represent two sub circuits of the integrated circuit;
   modify the divided two subgraphs to ensure each node of each subgraph to have a DC path to GND or VDD; and
   analyze the two subgraphs.

14. The article as in claim 13, wherein a capacitor is not divided between the two subgraphs and is duplicated in the two subgraphs.

15. The article as in claim 13, wherein an inductor is not divided between the two subgraphs and is duplicated in the two subgraphs.

16. The article as in claim 13, wherein a transistor is not divided between the two subgraphs and is duplicated in the two subgraphs.

17. The article as in claim 13, wherein a gate having a plurality of transistors is not divided between the two subgraphs and is duplicated in the two subgraphs.

18. The article as in claim 13, wherein edges in one branch are assigned to the same subgraph.

19. The article as in claim 13, wherein edges of a node whose degree is two are assigned to the same subgraph.

20. The article as in claim 13, wherein each subgraph is free of a loop.

21. The article as in claim 13, wherein a number of loops for nodes in each subgraph is minimized.

22. The article as in claim 13, wherein resistors of the integrated circuit are evenly divided between the two subgraphs.

23. The article as in claim 13, further comprising applying a direct matrix conversion method to analyze each of the two subgraphs.

24. The article as in claim 13, wherein the search is a breadth first search.

25. An article comprising at least one non-transitory machine-readable medium that stores machine-executable instructions, the instructions causing processor electronics to perform operations comprising:

representing an integrated circuit as an undirected graph;

conducting, from one or more nodes connected to GND or VDD in the graph, a search to identify nodes in the undirected graph;

dividing edges of nodes identified during the search to form exactly two subgraphs that respectively represent two sub circuits of the integrated circuit, wherein the two sub circuits represent independent circuit paths;

modifying the divided two subgraphs to ensure each node of each subgraph has a DC path to GND or VDD, wherein an edge assigned to one of the two subgraphs can be reassigned to the other subgraph to provide a DC path for the edge; and analyzing the two subgraphs.

* * * * *